United States Patent
Pan

(10) Patent No.: US 8,084,795 B2
(45) Date of Patent: Dec. 27, 2011

(54) RESONANT CAVITY COMPLEMENTARY OPTOELECTRONIC TRANSISTORS

(75) Inventor: James Pan, West Jordan, UT (US)

(73) Assignee: James Nan Hsi Pan, Costa Mesa, CA (US)

( * ) Notice: Subject to any disclaimer, the term of this patent is extended or adjusted under 35 U.S.C. 154(b) by 266 days.

(21) Appl. No.: 12/470,566

(22) Filed: May 22, 2009

(65) Prior Publication Data

US 2010/0296540 A1 Nov. 25, 2010

(51) Int. Cl.
*H01S 5/00* (2006.01)
*H01L 33/00* (2010.01)

(52) U.S. Cl. .............................. 257/288; 372/E45.012

(58) Field of Classification Search ........... 257/E29.069–E29.071, E29.245, 257/E49.001–E49.004, 116, 117, 432–437, 257/E33.056–E33.059, E25.032, 288, 438, 257/E33.053, 13, 79–106, 918, E51.018–E51.022, 257/E33.001–E33.077, E33.054, E25.028, 257/E31.058, E31.063, E31.115, E27.133–E27.139, 257/458, 656, 252–254, 257–258, 594, 910, 257/E33.046, E27.046, E27.051; 257/186, 257/199, 481–482, E21.354, E21.355, E21.356, 257/E21.357, 46, E29.339, E29.309, 314–326, 257/163–166, 197, 205, 273, E21.179–E21.182, 257/E21.209–E21.21, E21.422, E21.423, 257/E21.679–E21.694, 351, 361, 378, 423, 257/427, 474, 477, E27.015, E27.03–E27.032, 257/E27.109; 257/E29.194–E29.225, 526, 257/539, 544, 565–593, 928, E51.004, E31.069, 257/E27.017, E27.019–E27.023, E27.037–E27.043, 257/E27.053–E27.058, E27.074–E27.078, 257/E27.106, E27.149, E29.03–E29.035, 257/E29.044–E29.045, E29.114–E29.124; 438/77, 84, 22–47, 69, 493, 503, 507, 956, 438/48, 93–95, 102, 104, 188, 189, 285, 438/603–604, 606, 930–933, 91, 380, 983, 438/379; 372/45.012

See application file for complete search history.

(56) References Cited

U.S. PATENT DOCUMENTS

| | | | | |
|---|---|---|---|---|
| 5,578,852 A | * | 11/1996 | Hayashi et al. | 257/351 |
| 7,279,701 B2 | * | 10/2007 | Kreps | 257/28 |
| 7,521,737 B2 | * | 4/2009 | Augusto | 257/233 |
| 7,569,869 B2 | * | 8/2009 | Jin et al. | 257/190 |
| 2002/0074612 A1 | * | 6/2002 | Bulucea et al. | 257/402 |
| 2009/0250733 A1 | * | 10/2009 | Adkisson et al. | 257/292 |
| 2009/0305499 A1 | * | 12/2009 | Gambino et al. | 438/637 |

* cited by examiner

*Primary Examiner* — Dao H Nguyen
*Assistant Examiner* — Tram H Nguyen

(57) ABSTRACT

The CMOS field effect transistors, used in microprocessors and other digital VLSI circuits, face major challenges such as thin gate dielectrics leakage and scaling limits, severe short channel effects, limited performance improvement with scaling, complicated fabrication process with added special techniques, and surface mobility degradation. This disclosure proposes a new CMOS-compatible optoelectronic transistor. The current is much higher than the MOS transistors, due to the high carrier mobility with bulk transportation. The optoelectronic transistors are scalable to the sub-nanometer ranges without short channel effects. It is also suitable for low power applications and ULSI circuits. The new transistor consists of a laser or LED diode as drain or source, and a photo sensor diode (avalanche photo diode) as source or drain. The transistor is turned on by applying a gate voltage, similar to the CMOS transistors, and a laser or LED light signal is sent to the nearby photo diode, causing an avalanche breakdown and high drain current. The transistor is surrounded by dielectrics and metal isolations, which serve as a metal box or cavity, so the generated laser or LED lights are confined and reflected back from the metal. The drain current increases exponentially with the drain or gate voltage. This exponential drain current vs. drain or gate voltage characteristics makes the optoelectronic transistor run much faster than the transitional linear MOSFET.

The optic transistor current-voltage characteristics are totally different from transitional CMOS transistors.

3 Claims, 7 Drawing Sheets

RESONANT CAVITY COMPLEMENTARY OPTOELECTRONIC TRANSISTORS

BRIEF SUMMARY OF THE INVENTION

There are three main units in the optoelectronic transistor. The first unit is a buried-channel CMOS transistor (N or PMOSFET). The second unit is for the laser or LED diode (with or without quantum wells and waveguide), located in the drain area. The third unit is the photo sensor diode or avalanche photo diode (APD), located in the source area. The transistor is surrounded by metal or metal silicides, forming a resonant light or electromagnetic wave cavity. The optic transistor I-V characteristics are totally different from transitional CMOS transistors.

FIG. 1 and FIG. 2 show the n and p type Resonant Cavity Optoelectronic Transistor (RCOT). For laser diode, there is a quantum well in between the $p^{++}$ and $n^{++}$ areas. A wave guide can be built by choosing the right sandwich materials with suitable index of reflection. The APD is at the source area. The drain is connected to the p++ (NFET) or n++ (PFET) under the surface. FIG. 3 illustrates the laser and photonic sensor diodes. According to FIG. 7, for the optoelectronic transistor, the drain current may increase exponentially with the drain or gate voltage, which is must faster than the linear drain current vs. drain/gate voltage characteristics of a regular MOSFET.

For NMOSFET, when a positive gate voltage and a positive drain voltage are applied (the source voltage is 0V), a laser or LED diode is forward biased, and light is generated from the interface of the $p^{++}$ and $n^{++}$ areas (The $p^{++}$ is connected to the drain with a positive voltage, and the $n^{++}$ is connected to the grounded source because the gate is turned on). These regions are extremely heavily doped ("degenerately" doped) to cause the "energy bandgap widening" effects—which in turn cause the "population inversion" for the lasing and stimulated emission. (Not necessary for the LED and spontaneous emission) The laser light follows the waveguide and reaches the depletion region of the APD (FIG. 3). The photon sensor diode is reverse-biased by the positive drain voltage at this time.

The laser or LED light causes photon-generated light current. This photonic current results in immediate avalanche breakdown with a large current flowing.

When the gate voltage is 0, the transistor channel is depleted and "pinched-off. The n++ source is floating—no current flows through the laser or LED diode, so no light can be produced. The avalanche process is terminated and the transistor is turned off.

FIG. 4 shows how the resonant light cavity works. When laser or LED lights are generated from the diode, they are reflected back by the metals in the surrounding areas, and by the metal silicide on top of the gate and source/drain. Since the APD is located near this cavity, the produced light causes instant avalanche breakdown and efficiently turns on the transistor.

FIG. 5 shows a different configuration of the device, with (or without) the "raised source drain (RSD)". Due to different requirements, the RSD structure can enhance the degrees of freedom for process integration. The quantum well may be located in the drain or channel region under the gate. Since there is no gate oxide for this configuration, there is a gate current flowing when the transistor is turned on.

A few methods can be implemented to fabricate the light and APD transistors. One way is to grow the compound semiconductors on a silicon wafer or selectively only in the drain area. The backside of the wafers can be polished and replaced with a layer of metal. The requirements for the p-n junctions in the light and sensor devices may be different. For example, the laser needs very heavily doped regions, wide bandgap (GaAs, GaAlAs, SiC, GaN . . . etc.) quantum wells, and waveguides. The APD may need narrow bandgap materials to improve the quantum efficiency. Even without the laser and avalanche photo diodes, with the device structure in FIGS. 1 and 2, it is possible to achieve higher drain current and improved performance through the drain diode, but the real bulk transportation might not be so evident without the laser-induced avalanche breakdown.

FIGURE CAPTIONS

FIG. 1 is a cross-section view of an n type resonant cavity optoelectronic transistor. Similar to a traditional NMOSFET, there is a gate, drain and source in the same location as CMOS. The CMOS source area is replaced with a photon sensing diode (which is also an avalanche breakdown diode). The drain area is replaced with a laser or LED diode.

FIG. 2 is a cross-section view of an p type resonant cavity optoelectronic transistor. The n regions are replaced with the p regions, and vice versa, from the n type transistor in FIG. 1.

FIG. 3 highlights quantum wells, and waveguide structures for the laser in the drain area.

Figure 1:
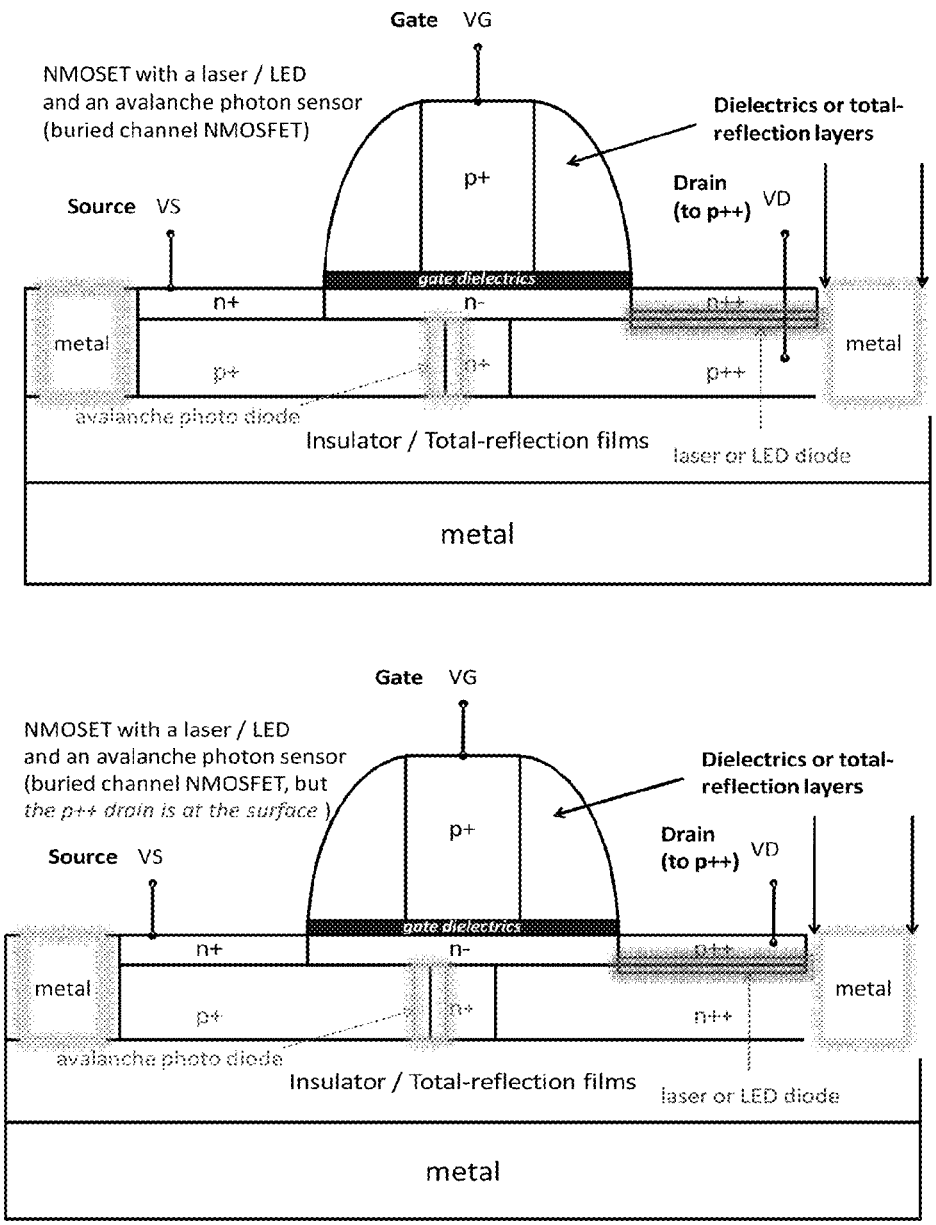
Figure 2:
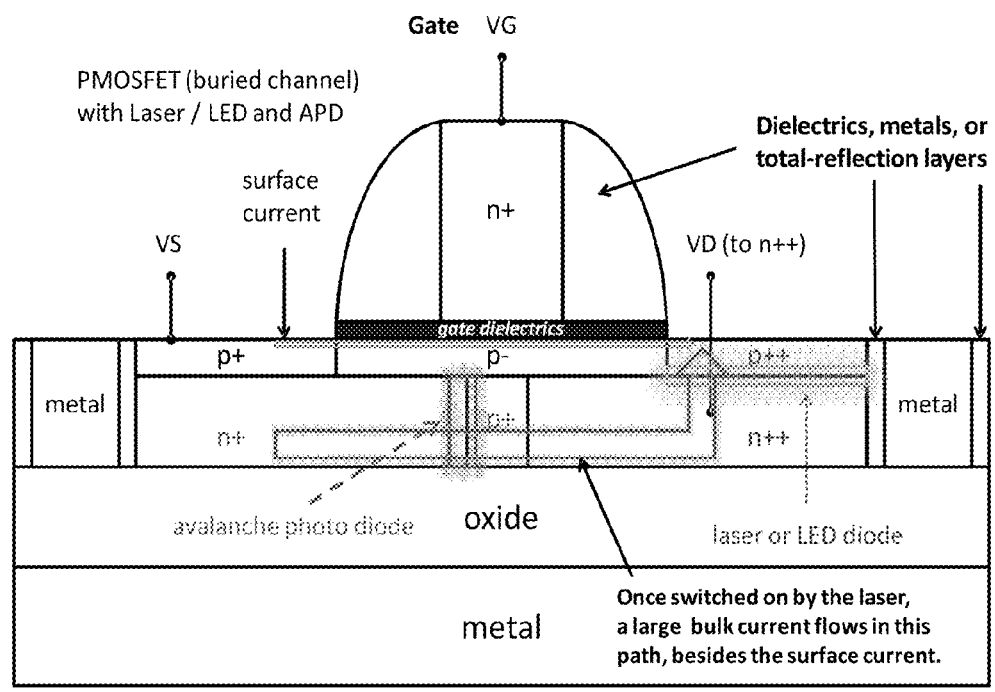
Figure 3:
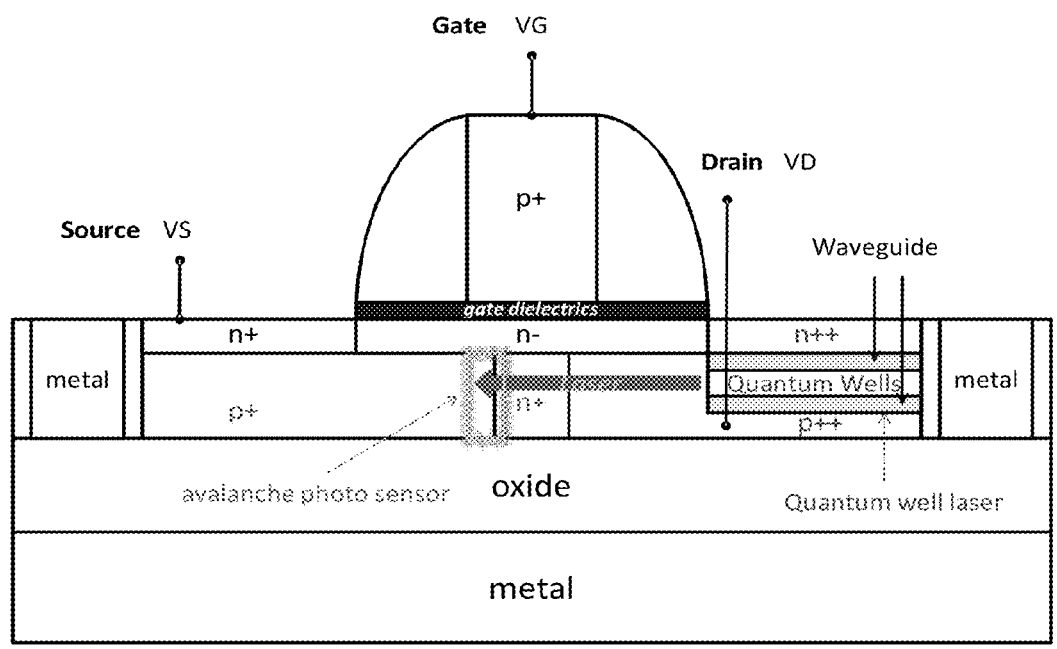
Figure 4:
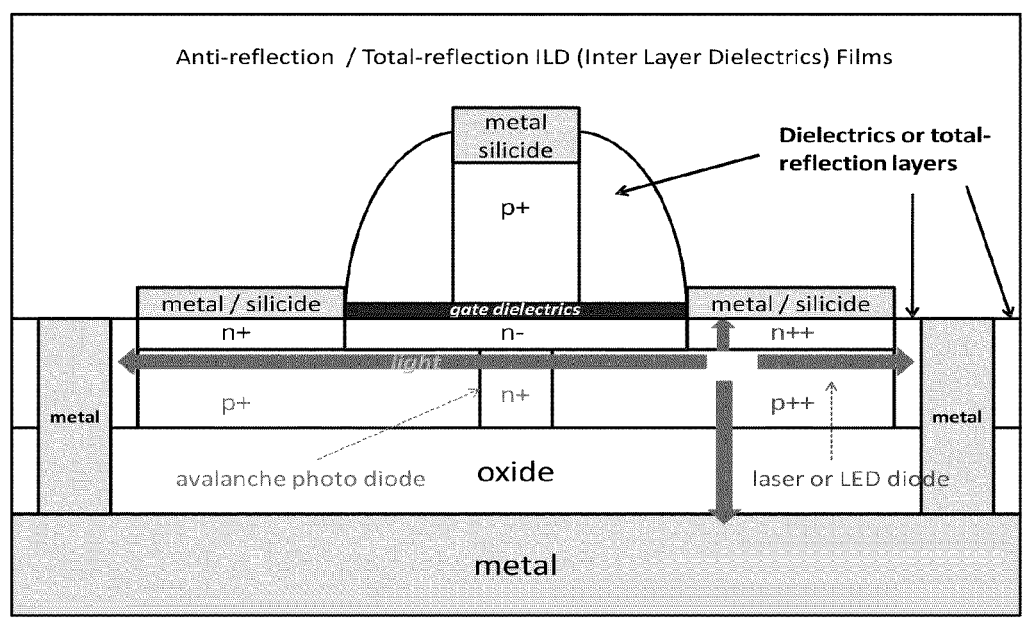
FIG. 4 shows how the resonant cavity works to confine the lights and electromagnetic wafers.
Figure 5:
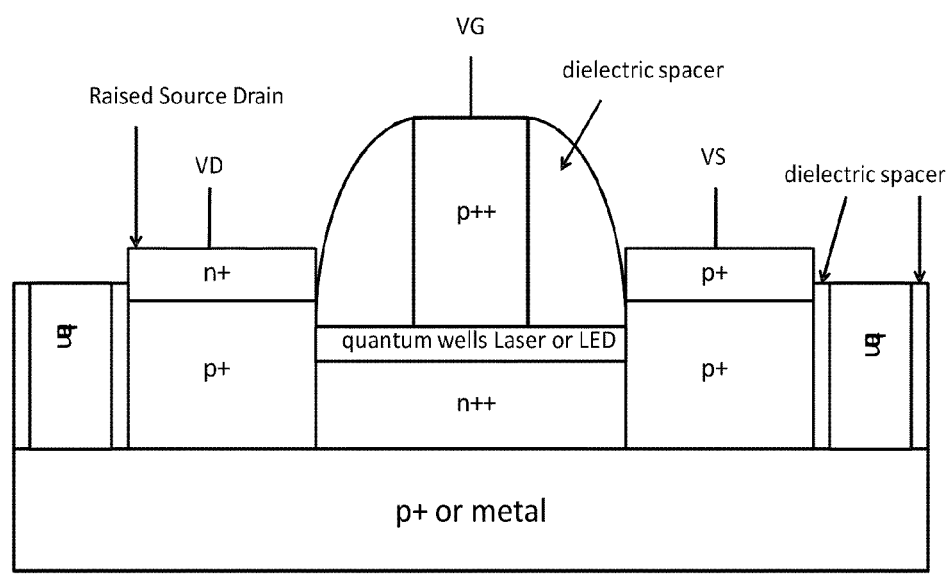
FIG. 5 shows the raised source drain (RSD) with a different configuration.
Figure 6:
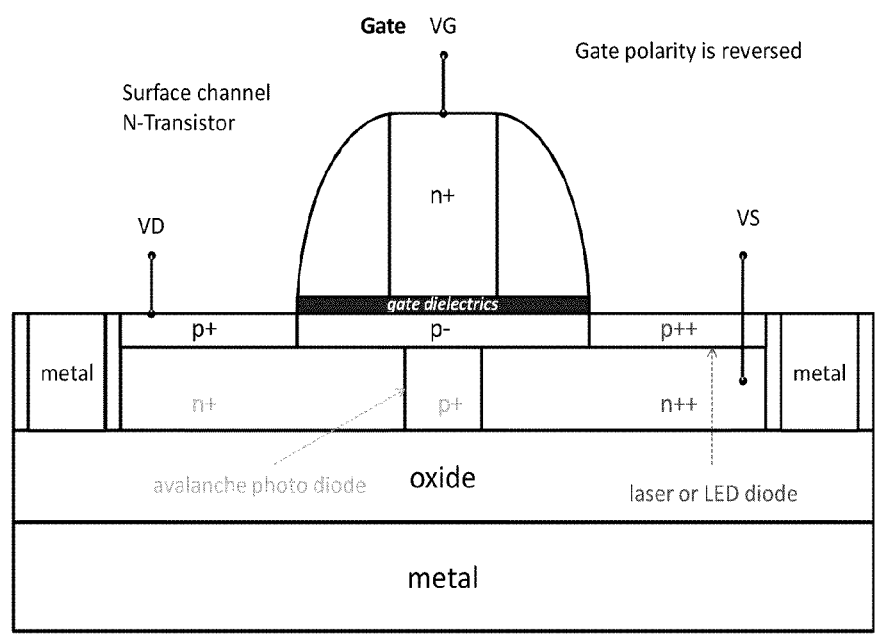
FIG. 6 shows a surface channel optoelectronic device. But the gate voltage polarity needs to be reversed compared to the buried channel device.
Figure 7:
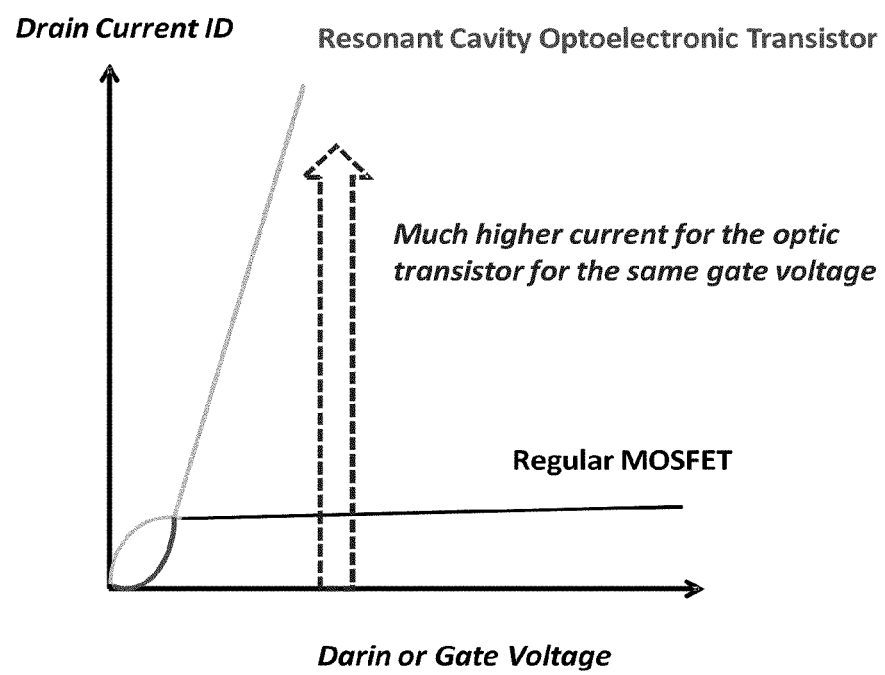
FIG. 7 shows the drain current vs. drain or gate voltage characteristics for an optoelectronic transistor and a regular MOSFET. The exponential increase of drain current makes the optic transistor function much faster than a regular linear MOSFET current.

The invention claimed is:
1. A optoelectronic transistor, comprising:
A MOSFET formed on a substrate;
A quantum-well laser embedded and integrated into a drain region of the transistor,
   wherein the quantum-well laser includes multiple very thin layers of semiconductors along the p-n junction of the drain, with alternative (high and low) bandgap energies and different doping concentrations, forming many electric potential (quantum) wells to enhance the laser effects when the MOSFET is switched on;
A wave guide integrated near the drain region, enclosing and surrounding the quantum well laser or other light or microwave emitting devices,
   wherein the wave guide includes multiple layers of semiconductors with various indices of refraction to confine lights, or dielectric materials for total refraction, as a wave guide for lights or microwaves;
A photon sensing device (a light or a microwave sensor, or an avalanche photo diode—APD) integrated near a source or the drain or a body regions,
   wherein the photon sensing device includes a p typed doped region, a very lightly doped region, and an n type doped region as a photon sensor to collect the photons or microwaves from the light or microwave emitting devices in the drain.
2. The optoelectronic transistor of claim 1, functions like a engine including a positive feedback loop is formed in between the light emitting device, photon sensing device, and the MOSFET, where the energy of the photon is converted to the energy of the electron, and vice versa, so the energy is amplified then converted to an enhanced output electric current or voltage.

3. The optoelectronic transistor of claim 1, wherein metals or metal silicides (for reflecting light or microwave) and dielectrics (as insulators for isolation) surrounded the MOSFET so that it configured to be a resonant cavity for lights or microwave.

* * * * *